(12) United States Patent
Gu et al.

(10) Patent No.: US 8,821,739 B2
(45) Date of Patent: *Sep. 2, 2014

(54) HIGH TEMPERATURE THERMAL ANNEALING PROCESS

(75) Inventors: Xinyu Gu, Lake Jackson, TX (US); Shih-Wei Chang, Natick, MA (US); Phillip D. Hustad, Manvel, TX (US); Jeffrey D. Weinhold, Lake Jackson, TX (US); Peter Trefonas, Medway, MA (US)

(73) Assignees: Rohm and Haas Electronic Materials LLC, Marlborough, MA (US); Dow Global Technologies LLC, Midland, MI (US)

( * ) Notice: Subject to any disclaimer, the term of this patent is extended or adjusted under 35 U.S.C. 154(b) by 175 days.

This patent is subject to a terminal disclaimer.

(21) Appl. No.: 13/547,246

(22) Filed: Jul. 12, 2012

(65) Prior Publication Data

US 2014/0014002 A1 Jan. 16, 2014

(51) Int. Cl.
| | |
|---|---|
| B44C 1/22 | (2006.01) |
| B05D 3/02 | (2006.01) |
| B81C 1/00 | (2006.01) |
| B82Y 40/00 | (2011.01) |
| C09D 183/00 | (2006.01) |
| C23C 18/00 | (2006.01) |

(52) U.S. Cl.
CPC .............. *B05D 3/0254* (2013.01); *B44C 1/227* (2013.01); *B81C 1/00531* (2013.01); *B82Y 40/00* (2013.01); *C09D 183/00* (2013.01); *C23C 18/00* (2013.01); *Y10S 438/947* (2013.01)
USPC ................... 216/41; 216/48; 216/49; 216/55; 216/64; 216/67; 438/710; 438/725; 438/947; 427/377; 427/379; 427/387

(58) Field of Classification Search
None
See application file for complete search history.

(56) References Cited

U.S. PATENT DOCUMENTS

| 7,964,107 B2 | 6/2011 | Millward | |
|---|---|---|---|
| 8,043,520 B2 | 10/2011 | Asakawa et al. | |
| 2004/0231777 A1* | 11/2004 | Hishiya et al. | 156/63 |
| 2008/0311402 A1 | 12/2008 | Jung et al. | |
| 2009/0092803 A1 | 4/2009 | Bita et al. | |
| 2009/0236309 A1 | 9/2009 | Millward et al. | |
| 2009/0240001 A1* | 9/2009 | Regner | 525/95 |
| 2009/0274887 A1 | 11/2009 | Millward et al. | |
| 2010/0323096 A1 | 12/2010 | Sills et al. | |
| 2011/0206905 A1 | 8/2011 | Buriak et al. | |
| 2011/0272381 A1 | 11/2011 | Millward et al. | |
| 2012/0046415 A1 | 2/2012 | Millward et al. | |
| 2013/0029113 A1* | 1/2013 | Nealey et al. | 428/195.1 |
| 2014/0002929 A1* | 1/2014 | Takizawa et al. | 360/135 |

OTHER PUBLICATIONS

Takenaka, et al, Formation of long-range stripe patterns with sub-10-nm half-pitch from directed self-assembly of block copolymer, Journal of Polymer Science: Part B, Polymer Physics, vol. 48, pp. 2297-2301 (2010). published online Sep. 13, 2010.
Yang, et al., Effect of added homopolymer on structures of thin films of PS-b-PDMS/PS mixture under solvent vapor annealing, Applied Surface Science, vol. 257, issue 11, pp. 4928-4934 (2011), available online Jan. 4, 2011.
Son, et al., Hierarchical Nanostructures by Sequential Self-Assembly of Styrene-Dimethylsiloxane Block Copolymers of Different Periods, Advanced Materials, vol. 23, pp. 634-639 (2011).
Ahn, et al., Temperature-Dependent Phase Behaviors in Cylinder-Forming Block Copolymers, International Journal of Molecular Sciences, issue 10, pp. 2169-2189 (2009), published May 15, 2009.
Copending U.S. Appl. No. 13/370,907.
Copending U.S. Appl. No. 13/547,230.

* cited by examiner

*Primary Examiner* — Anita Alanko
(74) *Attorney, Agent, or Firm* — Thomas S. Deibert

(57) ABSTRACT

A method for processing a substrate is provided; wherein the method comprises applying a film of a copolymer composition, comprising a poly(styrene)-b-poly(siloxane) block copolymer component; and, an antioxidant to a surface of the substrate; optionally, baking the film; subjecting the film to a high temperature annealing process under a gaseous atmosphere for a specified period of time; followed by a treatment of the annealed film to remove the poly(styrene) from the annealed film and to convert the poly(siloxane) in the annealed film to $SiO_x$.

9 Claims, 1 Drawing Sheet

HIGH TEMPERATURE THERMAL ANNEALING PROCESS

The present invention relates to the field of self assembling block copolymers. In particular, the present invention is directed to a specific thermal annealing process for poly(styrene)-b-poly(siloxane) block copolymer film compositions deposited onto the surface of a substrate.

Some block copolymers, consisting of two or more distinct homopolymers joined end to end, are known to self-assemble into periodic micro domains having typical dimensions of 10 nanometers to 50 nanometers (nm). The possibility of using such micro domains to pattern surfaces has attracted increasing interest because of the expense and difficulty of patterning in nanoscale dimensions (especially sub-45 nm) using optical lithography.

Controlling the lateral placement of the block copolymer micro domains on the substrates continues to be a challenge, however. This problem has been previously addressed using lithographically pre-defined topographic and/or chemical patterning of the substrate. Previous studies have demonstrated that self-assembled block copolymer micro domains in form of lamellae can be directed to follow chemical patterning of the substrate, yielding periodicities close to those of the chemical pre-patterns. Other studies have shown that by controlling the surface wetting properties of the block copolymer on the bottom and side walls of a topographic pre-pattern, the lamellae can be directed to follow the topographic pre-pattern. The lamellae formed line/space patterns of smaller dimensions than the substrate pre-pattern, subdividing the topographic pre-pattern into a higher frequency line pattern; that is, a line pattern having a smaller pitch. One limitation of block copolymer patterning is the propensity of the patterns to form everywhere on the pre-pattern surface, for topographic and/or chemical guiding pre-patterns.

The ability to shrink the size of various features on a given substrate (e.g., gates in field effect transistors) is currently limited by the wavelength of light used to expose photoresists (i.e., 193 nm). These limitations create a significant challenge for the fabrication of features having a critical dimension (CD) of <50 nm. The use of conventional block copolymers present difficulties in orientation control and long range ordering during the self assembly process. Moreover, such block copolymers frequently provide inadequate etch resistance for subsequent processing steps.

Diblock copolymers of poly(styrene) and poly(dimethylsiloxane) offer promise for application in the patterning of nanoscale dimensions (especially sub-45 nm) using directed self assembly techniques. Conventional wisdom in the art; however, is that the use of poly(styrene)-b-poly(dimethylsiloxane) block copolymers in such operations cannot effectively be thermally annealed. Accordingly, those in the art have developed a variety of alternative techniques for processing poly(styrene)-b-poly(dimethylsiloxane) block copolymers.

For example, in U.S. Patent Publication No. 2011/0272381; Millward, et al., disclose a solvent annealing method for processing diblock copolymer films such as poly(styrene)-b-poly(dimethylsiloxane).

Notwithstanding, there remains a need for alternative methods of processing poly(styrene)-b-poly(siloxane) diblock copolymer compositions for use in directed self assembly applications.

The present invention provides a method for processing a substrate, comprising: providing a substrate having a surface; providing a copolymer composition, comprising: a poly(styrene)-b-poly(siloxane) block copolymer component, wherein the number average molecular weight of the poly(styrene)-h-poly(siloxane) block copolymer component is 5 to 1,000 kg/mol; and, an antioxidant; applying a film of the copolymer composition to the surface of the substrate; optionally, baking the film; annealing the film by heating the film at 275 to 350° C. under a gaseous atmosphere for a period of 1 second to 4 hours; and, treating the annealed film to remove the poly(styrene) from the annealed film and to convert the poly(siloxane) in the annealed film to $SiO_x$.

The present invention provides a method for processing a substrate, comprising: providing a substrate having a surface; providing a copolymer composition, comprising: a poly(styrene)-b-poly(siloxane) block copolymer component, wherein the number average molecular weight of the poly(styrene)-b-poly(siloxane) block copolymer component is 5 to 1,000 kg/mol; and, an antioxidant, wherein the antioxidant is selected from the group consisting of: an antioxidant containing at least one 2,6-di-tert-butylphenol moiety; an antioxidant containing at least one moiety according to the formula

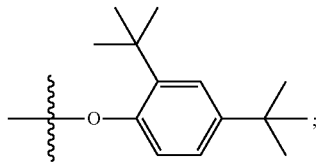 [SMILES: *Oc1ccc(C(C)(C)C)cc1C(C)(C)C]

an antioxidant containing at least one moiety according to the formula

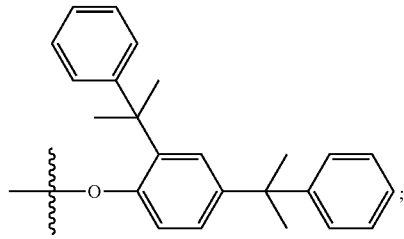

an antioxidants containing at least one moiety according to the formula

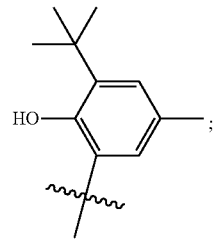 [SMILES: *c1cc(C)cc(C(C)(C)C)c1O]

and, mixtures thereof; applying a film of the copolymer composition to the surface of the substrate; optionally, baking the film; annealing the film by heating the film at 275 to 350° C. under a gaseous atmosphere for a period of 1 second to 4 hours; and, treating the annealed film to remove the poly(styrene) from the annealed film and to convert the poly(siloxane) in the annealed film to $SiO_x$.

The present invention provides a method for processing a substrate, comprising: providing a substrate having a surface; providing a copolymer composition, comprising: a poly(styrene)-b-poly(siloxane) block copolymer component, wherein the number average molecular weight of the poly(styrene)-b-poly(siloxane) block copolymer component is 5 to 1,000 kg/mol; and, an antioxidant, wherein the antioxidant component is an antioxidant selected from the group consisting of

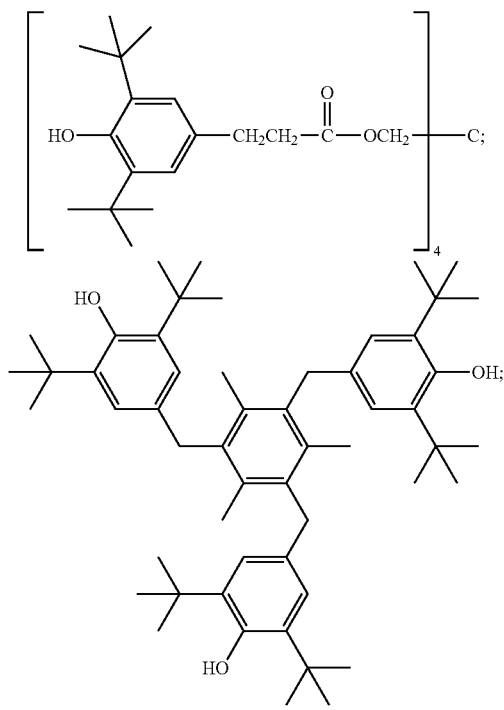

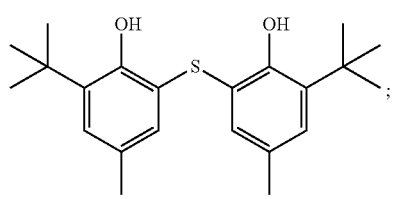

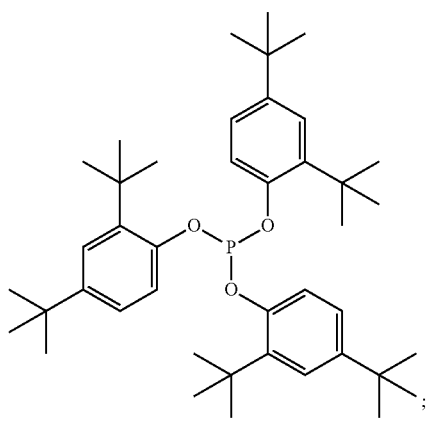

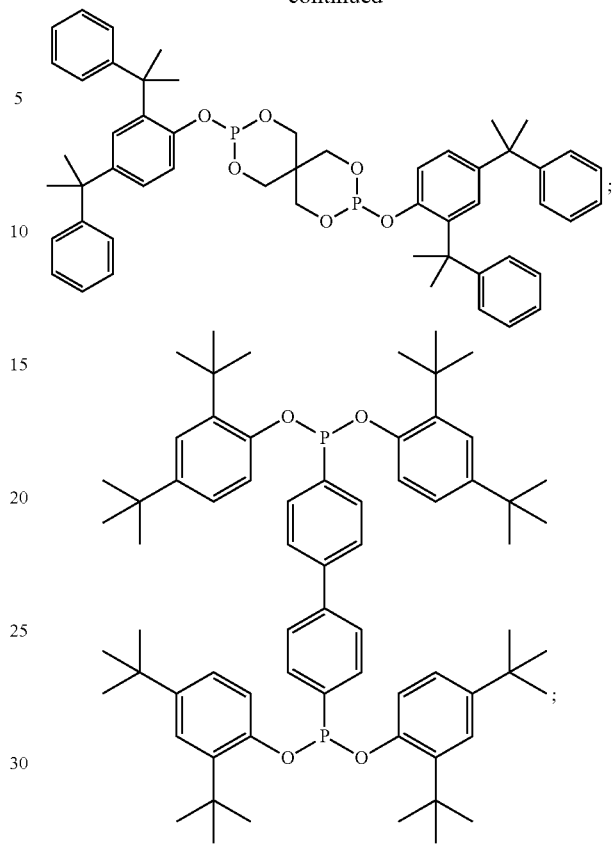

and, mixtures thereof; applying a film of the copolymer composition to the surface of the substrate; optionally, baking the film; heating the film at 275 to 350° C. under a gaseous atmosphere for a period of 1 second to 4 hours; and, treating the annealed film to remove the poly(styrene) from the annealed film and to convert the poly(siloxane) in the annealed film to $SiO_x$.

The present invention provides a substrate processed according to a method of the present invention.

The present invention provides substrates that have been processed according to the method of the present invention, wherein a surface of the substrate comprises sublithographic $SiO_x$ features.

DETAILED DESCRIPTION

Figure 3:
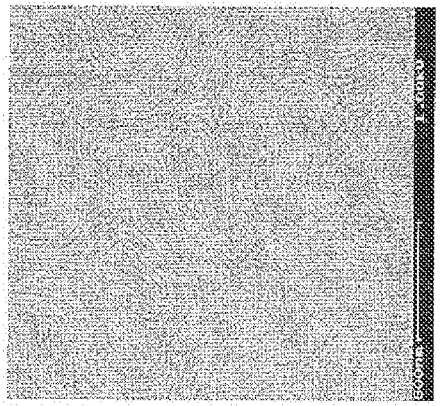
FIG. 3 is a depiction of a top down scanning electron microscopic ("SEM") image of the product film prepared according to Example 8.

The present invention provides a method for forming lithographically useful line and space features used in the subsequent pattern transfer processing in the construction of devices requiring microscopic etching or micropatterned surfaces (e.g., microelectronics, microsensors and biochips).

The method of the invention provides for the creation of patterns having pitch dimensions divisible by an integer factor relative to a guiding pattern created on a substrate using conventional lithographic means. The ability to form such highly resolved patterns with smaller dimensions, for example, one half or one fourth that which can be produced using conventional lithographic techniques enables, for example, entire new technologies in the design and manufacture of semiconductor chips.

The term "PSt-b-PSI block copolymer" used herein and in the appended claims is short hand for a poly(styrene)-block-poly(siloxane) diblock copolymer.

The term "$M_N$" used herein and in the appended claims in reference to a block copolymer of the present invention is the number average molecular weight of the block copolymer (in g/mol) determined according to the method used herein in the Examples.

The term "$M_{N\text{-}Blend}$ or blend number average molecular weight" used herein and in the appended claims in reference to a PSt-b-PSi blend used in the copolymer composition of the present invention is the weighted average of the number average molecular weights of the PSt-b-PSi block copolymers included in the PSt-b-PSi blend.

The term "$M_W$" used herein and in the appended claims in reference to a block copolymer of the present invention is the weight average molecular weight of the block copolymer (in g/mol) determined according to the method used herein in the Examples.

The term "$M_{W\text{-}Blend}$ or blend weight average molecular weight" used herein and in the appended claims in reference to a PSt-h-PSi blend used in the copolymer composition of the present invention is the weighted average of the weight average molecular weights of the PSt-b-PSi block copolymers included in the PSt-b-PSi blend.

The term "PD" used herein and in the appended claims in reference to a block copolymer of the present invention is the polydispersity of the block copolymer determined according to the following equation:

$$PD = \frac{M_W}{M_N}.$$

The term "average molecular weight" used herein and in the appended claims in reference to (a) a PSt-b-PSi block copolymer component that is a single PSt-b-PSi block copolymer, means the number average molecular weight, $M_N$, for that PSt-b-PSi block copolymer; and (b) a PSt-b-PSi block copolymer component that is a blend of two or more different PSt-b-PSi block copolymers, means the weighted average of the number average molecular weights, $M_N$, of the two or more different PSt-b-PSi block copolymers in the blend.

The term "$Wf_{Pst}$" used herein and in the appended claims in reference to a PSt-b-PSi block copolymer is the weight percent of the poly(styrene) block in the block copolymer.

The term "$Wf_{Pst\text{-}Blend}$ or blend poly(styrene) weight fraction" used herein and in the appended claims in reference to a PSt-b-PSi blend used in the copolymer composition of the present invention is the weighted average of the weight percent of the polystyrene) block in the PSt-b-PSi block copolymers included in the PSt-b-PSi blend.

The term "$Wf_{PSi}$" used herein and in the appended claims in reference to a PSt-b-PSi block copolymer of the present invention is the weight percent of the poly(siloxane) block in the block copolymer.

The term "$Wf_{PSi\text{-}Blend}$ or blend poly(siloxane) weight fraction" used herein and in the appended claims in reference to a PSt-b-PSi blend used in the copolymer composition of the present invention is the weighted average of the weight percent of the poly(siloxane) block in the PSt-b-PSi block copolymers included in the PSt-b-PSi blend.

Block copolymers are polymers that are synthesized from two or more different monomers and exhibit two or more polymeric chain segments that are chemically different, but yet, are covalently bound to one another. Diblock copolymers are a special class of block copolymers derived from two different monomers (e.g., A and B) and having a structure comprising a polymeric block of A residues covalently bound to a polymeric block of B residues (e.g., AAAAA-BBBBB).

The copolymer composition used in the method of the present invention, comprises a poly(styrene)-b-poly(siloxane) block copolymer component; and, an antioxidant; wherein the poly(styrene)-b-poly(siloxane) block copolymer component is selected from the group consisting of (a) a single PSt-b-PSi block copolymer; and, (b) a blend of at least two different PSt-b-PSi block copolymers.

When the poly(styrene)-b-poly(siloxane) block copolymer component used in the method of the present invention is a single PSt-b-PSi block copolymer, the PSt-b-PSi block copolymer used preferably exhibits a number average molecular weight, $M_N$, of 5 to 1,000 kg/mol (preferably 25 to 1,000 kg/mol; more preferably 30 to 1,000 kg/mol; still more preferably 30 to 100 kg/mol; most preferably 30 to 60 kg/mol); and, a polydispersity, PD, of 1 to 3 (preferably 1 to 2; most preferably 1 to 1.2). Preferably, the poly(styrene)-b-poly(siloxane) block copolymer component used in the method of the present invention is selected to exhibit a poly(siloxane) weight fraction, $Wf_{PSi}$, of 0.34 to 0.64 (preferably 0.47 to 0.50). Preferably, the poly(styrene)-b-poly(siloxane) block copolymer component used in the method of the present invention is selected to exhibit a poly(siloxane) weight fraction, $Wf_{PSi}$, of 0.19 to 0.33 (preferably 0.21 to 0.28; most preferably 0.22 to 0.25). Given the teachings provided herein, one of ordinary skill in the art will be able to deposit such a copolymer composition comprising a single PSt-b-PSi block copolymer using the method of the present invention, wherein cylindrical poly(siloxane) domains in the deposited copolymer composition will self assemble to orient themselves with their axes of symmetry parallel to the surface of the substrate, perpendicular to the surface of the substrate or a combination of parallel and perpendicular to the surface of the substrate, through the selection and control of the film deposition conditions, for example: (a) the substrate's surface energy (i.e., by pretreating the surface of the substrate with an interposing material), (b) the thickness of the film of copolymer composition deposited, (c) the bake profile of the deposited copolymer composition (i.e., bake temperature and bake time) and (d) the anneal profile of the deposited copolymer composition (i.e., anneal temperature and anneal time).

When the poly(styrene)-b-poly(siloxane) block copolymer component used in the method of the present invention is a blend of at least two different PSt-b-PSi block copolymers, the at least two different PSt-b-PSi block copolymers are preferably selected from the group of PSt-b-PSi block copolymers having a number average molecular weight, $M_N$, of 1 to 1,000 kg/mol (preferably 1 to 100 kg/mol; most preferably 5 to 60 kg/mol); and a polydispersity, PD, of 1 to 3 (preferably 1 to 2; most preferably 1 to 1.2). The blend of at least two different PSt-b-PSi block copolymers used preferably exhibits a blend number average molecular weight, $M_{N\text{-}Blend}$, of 5 to 1,000 kg/mol (preferably 25 to 1,000 kg/mol, more preferably 30 to 1,000 kg/mol; still more preferably 30 to 100; most preferably 30 to 60 kg/mol). Preferably, the blend of at least two different PSt-b-PSi block copolymers used preferably exhibits a blend poly(siloxane) weight fraction, $Wf_{PSi\text{-}Blend}$, of 0.34 to 0.64 (preferably 0.47 to 0.50). Preferably, the blend of at least two different PSt-b-PSi block copolymers used preferably exhibits a blend poly(siloxane) weight fraction, $Wf_{PSi\text{-}Blend}$, of 0.19 to 0.33 (preferably 0.21 to 0.28; most preferably 0.22 to 0.25). Preferred poly(styrene)-b-poly(siloxane) block copolymer components comprise a blend of at least two different PSt-b-PSi block copolymers. When compared on an equivalent molecular weight (i.e., $M_{N\text{-}single\ PSt\text{-}b\text{-}PSi} = M_{N\text{-}Blend}$) and an equivalent poly (dimethylsiloxane) weight fraction (i.e., $Wf_{PSi\text{-}single\ PSt\text{-}b\text{-}PSi} = Wf_{PSi\text{-}Blend}$) basis, the copolymer compositions comprising a blend of PSt-b-PSi block copolymers provide significant value over single PSt-b-PSi block copolymer compositions in that the blend systems tend to exhibit faster annealing profiles and lower defectivity (compared on an equivalent molecular weight/PSi weight fraction basis in directed self assembly applications used to form periodic nanostructures, such as line/space patterns on silicon containing substrates. Given the teachings provided herein, one of ordinary skill in the art will be able to deposit such a copolymer composition comprising a blend of PSt-b-PSi block copolymers using the method of the present invention, wherein cylindrical poly(siloxane) domains in the deposited copolymer composition will self assemble to orient themselves with their axes of symmetry parallel to the surface of the substrate, perpendicular to the surface of the substrate or a combination of parallel and perpendicular to the surface of the substrate, through the selection and control of the film deposition conditions, for example: (a) the substrate's surface energy (i.e., by pretreating the surface of the substrate with an interposing material), (b) the thickness of the film of copolymer composition deposited, (c) the bake profile of the deposited copolymer composition (i.e., bake temperature and bake time) and (d) the anneal profile of the deposited copolymer composition (i.e., anneal temperature and anneal time).

Preferably, the poly(styrene)-b-poly(siloxane) block copolymer compositions used in the method of the present invention have a poly(styrene) block, wherein the poly(styrene) block includes residues from at least one of styrene, deuterated styrene, styrene block modifying monomer and deuterated styrene block modifying monomer. More preferably, wherein the poly(styrene) block includes 0 to 100 wt % (preferably, 0 to 15 wt %; more preferably, 0.001 to 15 wt %) of styrene block modifying monomer derived units and deuterated styrene block modifying monomer derived units combined.

Preferably, the styrene block monomer is selected from the group consisting of hydroxystyrene (e.g., 4-hydroxystyrene; 3-hydroxystyrene; 2-hydroxystyrene; 2-methyl-4-hydroxystyrene; 2-tertbutyl-4-hydroxystyrene; 3-methyl-4-hydroxystyrene; 2-fluoro-4-hydroxystyrene; 2-chloro-4-hydroxystyrene; 3,4-dihydroxystyrene; 3,5-dihydroxystyrene; 3,4,5-trihydroxystyrene; 3,5-dimethyl-4-hydroxystyrene; 3,5-tert-butyl-4-hydroxystyrene); siloxystyrene (e.g., 4-trimethylsiloxystyrene; and 3,5-dimethyl-4-trimethylsiloxystyrene); and a 4-acetoxystyrene (e.g., 3,5-dimethyl-4-acetoxystyrene; 3,5-dibromo-4-acetoxystyrene; 3,5-dichloro-4-acetoxystyrene); and, combinations thereof. More preferably the styrene block monomer is selected from the group consisting of 4-hydroxystyrene; 3-hydroxystyrene; 2-hydroxystyrene; 2-methyl-4-hydroxystyrene; 2-tertbutyl-4-hydroxystyrene; 3-methyl-4-hydroxystyrene; 2-fluoro-4-hydroxystyrene; 2-chloro-4-hydroxystyrene; 3,4-dihydroxystyrene; 3,5-dihydroxystyrene; 3,4,5-trihydroxystyrene; 3,5-dimethyl-4-hydroxystyrene; 3,5-tert-butyl-4-hydroxystyrene; and, combinations thereof. Most preferably, the styrene block modifying monomer is selected from the group consisting of 4-hydroxystyrene; 3-hydroxystyrene; 2-hydroxystyrene; and, combinations thereof.

Preferably, the deuterated styrene block monomer is selected from the group consisting of deuterated hydroxystyrene (e.g., deuterated 4-hydroxystyrene; deuterated 3-hydroxystyrene; deuterated 2-hydroxystyrene; deuterated 2-methyl-4-hydroxystyrene; deuterated 2-tertbutyl-4-hydroxystyrene; deuterated 3-methyl-4-hydroxystyrene; deuterated 2-fluoro-4-hydroxystyrene; deuterated 2-chloro-4-hydroxystyrene; deuterated 3,4-dihydroxystyrene; deuterated 3,5-dihydroxystyrene; deuterated 3,4,5-trihydroxystyrene; deuterated 3,5-dimethyl-4-hydroxystyrene; deuterated 3,5-tert-butyl-4-hydroxystyrene); deuterated siloxystyrene (e.g., deuterated 4-trimethylsiloxystyrene; and deuterated 3,5-dimethyl-4-trimethylsiloxystyrene); a deuterated 4-acetoxystyrene (e.g., deuterated 3,5-dimethyl-4-acetoxystyrene; deuterated 3,5-dibromo-4-acetoxystyrene; and deuterated 3,5-dichloro-4-acetoxystyrene); and; combinations thereof. More preferably the deuterated styrene block monomer is selected from the group consisting of deuterated 4-hydroxystyrene; deuterated 3-hydroxystyrene; deuterated 2-hydroxystyrene; deuterated 2-methyl-4-hydroxystyrene; deuterated 2-tertbutyl-4-hydroxystyrene; deuterated 3-methyl-4-hydroxystyrene; deuterated 2-fluoro-4-hydroxystyrene; deuterated 2-chloro-4-hydroxystyrene; deuterated 3,4-dihydroxystyrene; deuterated 3,5-dihydroxystyrene; deuterated 3,4,5-trihydroxystyrene; deuterated 3,5-dimethyl-4-hydroxystyrene; deuterated 3,5-tert-butyl-4-hydroxystyrene; and, combinations thereof. Most preferably, the deuterated styrene block modifying monomer is selected from the group consisting of deuterated 4-hydroxystyrene; deuterated 3-hydroxystyrene; deuterated 2-hydroxystyrene; and, combinations thereof.

Preferably, the poly(styrene)-b-poly(siloxane) block copolymer compositions used in the method of the present invention have a poly(siloxane) block, wherein the poly(siloxane) block includes residues from at least one of siloxane monomers and deuterated siloxane monomers. More preferably, wherein the poly(siloxane) block includes >75 wt % (more preferably, >90 wt %; most preferably, >95 wt %) of dimethylsiloxane derived units.

Preferably, the siloxane monomer is selected from the group consisting of aryl(aryl)siloxane (e.g., phenyl(phenyl)siloxane); aryl(alkyl)siloxane (e.g., phenyl(methyl)siloxane); alkyl(alkyl)siloxane (e.g., dimethylsiloxane; methyl(ethyl)siloxane); halogenated alkyl(alkyl)siloxane (e.g., trifluoropropyl(methyl)siloxane); alkylsiloxane; and, combinations thereof. More preferably, the siloxane monomer is selected from the group consisting of phenyl(methyl)siloxane, dimethylsiloxane, methyl(ethyl)siloxane, tripropyl(methyl)siloxane and combinations thereof. Most preferably, the siloxane monomer is dimethylsiloxane.

Preferably, the deuterated siloxane monomer is selected from the group consisting of deuterated aryl(aryl)siloxane (e.g., deuterated phenyl(phenyl)siloxane); deuterated aryl(alkyl)siloxane (e.g., deuterated phenyl(methyl)siloxane); deuterated alkyl(alkyl)siloxane (e.g., deuterated dimethylsiloxane; deuterated methyl(ethyl)siloxane); deuterated halogenated alkyl(alkyl)siloxane (e.g., deuterated trifluoropropyl(methyl)siloxane); deuterated alkylsiloxane; and, combinations thereof. More preferably, the deuterated siloxane monomer is selected from the group consisting of deuterated phenyl(methyl)siloxane, deuterated dimethylsiloxane, deuterated methyl(ethyl)siloxane, deuterated tripropyl (methyl)siloxane and combinations thereof. Most preferably, the deuterated siloxane monomer is deuterated dimethylsiloxane.

The copolymer composition used in the method of the present invention contains an antioxidant. Preferably, the copolymer composition used in the method of the present invention contains >2 wt % antioxidant (based on the weight of the PSt-b-PSi block copolymer component). More preferably, the copolymer composition used in the method of the present invention contains >2 to 10 wt % antioxidant (based on the weight of the PSt-b-PSi block copolymer component). Most preferably, the copolymer composition used in the method of the present invention contains 5 to 10 wt % antioxidant (based on the weight of the PSt-b-PSi block copolymer component).

Antioxidant contained in the copolymer composition used in the method of the present invention can be selected from primary antioxidants and secondary antioxidants. Preferably, the antioxidant is selected from the group consisting of: antioxidants containing at least one (preferably at least two; more preferably at least three; most preferably three to four) 2,6-di-tert-butylphenol moiety; antioxidants containing at least one (preferably at least two; more preferably at least three; most preferably three to four) moiety according to the formula

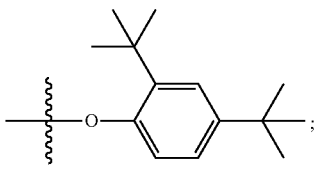

antioxidants containing at least one (preferably at least two; most preferably two) moiety according to the formula

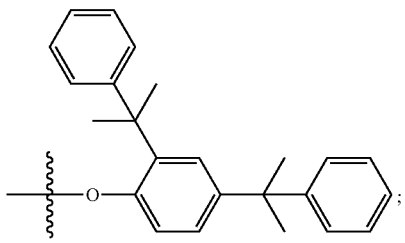 [SMILES: *Oc1ccc(C(C)(C)c2ccccc2)cc1C(C)(C)c1ccccc1]

and,
antioxidants containing at least one (preferably at least two; most preferably two) moiety according to the formula

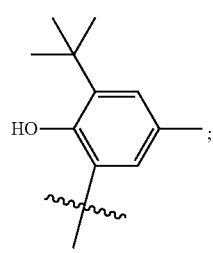

and,
mixtures thereof. More preferably, the antioxidant is selected from the group consisting of:

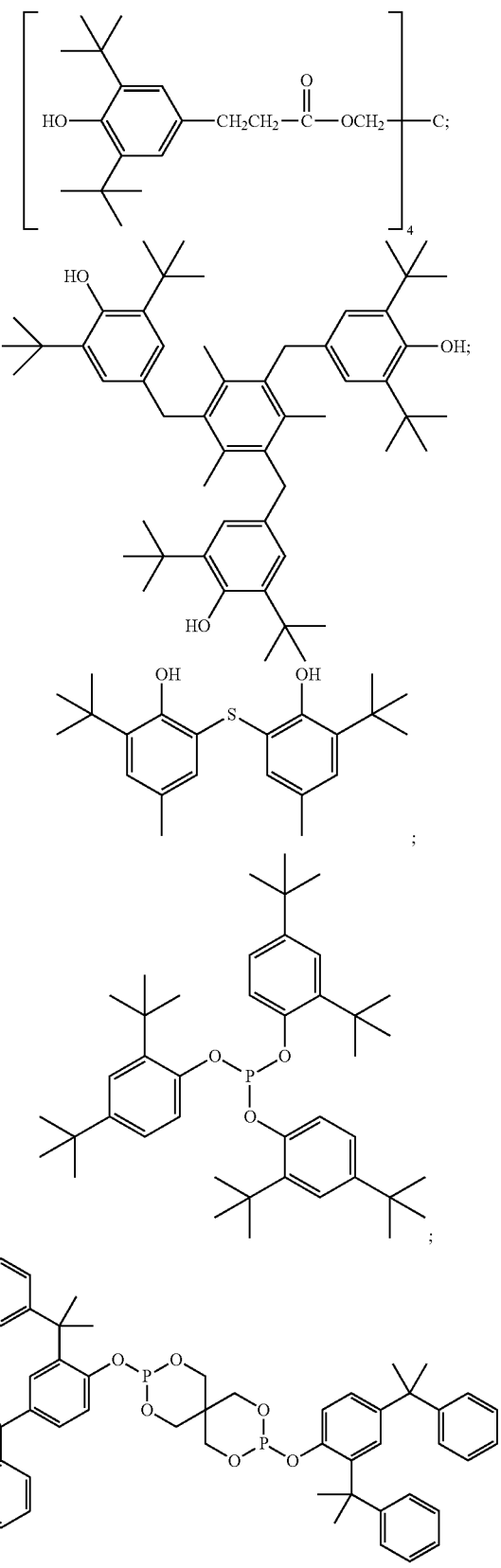

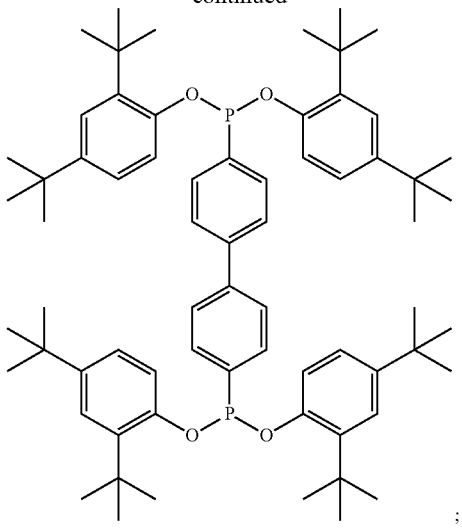

and,
mixtures thereof. Still more preferably, the antioxidant is selected from the group consisting of

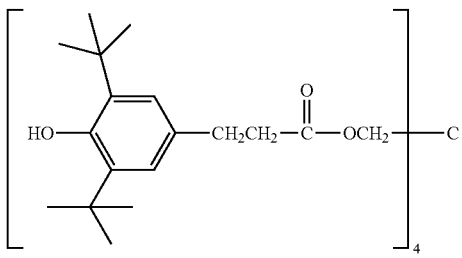

and mixtures of

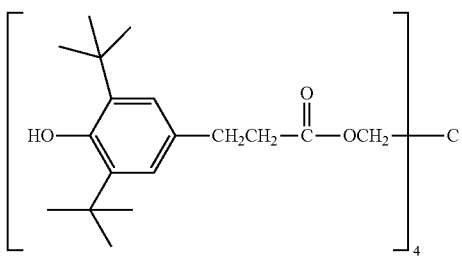

and one or more other antioxidants. Most preferably, the antioxidant is

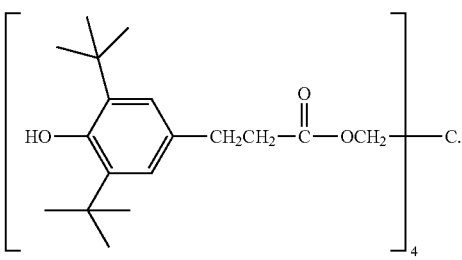

Preferably, the antioxidant (or mixture of antioxidants) contained in the copolymer composition used in the method of the present invention has an average molecular weight of ≥358 g/mol. More preferably, the antioxidant (or mixture of antioxidants) contained in the copolymer composition used in the method of the present invention has an average molecular weight of ≥600 g/mol. Most preferably, the antioxidant (or mixture of antioxidants) contained in the copolymer composition used in the method of the present invention has an average molecular weight of ≥1,000 g/mol.

Preferably, the antioxidant (or mixture of antioxidants) contained in the copolymer composition used in the method of the present invention has an average boiling point temperature measured at 760 mm Hg (101.3 kPa) of >400° C. More preferably, the antioxidant (or mixture of antioxidants) contained in the copolymer composition used in the method of the present invention has an average boiling point temperature measured at 760 mm Hg (101.3 kPa) of >500° C. Still more preferably, the antioxidant (or mixture of antioxidants) contained in the copolymer composition used in the method of the present invention has an average boiling point temperature measured at 760 mm Hg (101.3 kPa) of >700° C. Yet still more preferably, the antioxidant (or mixture of antioxidants) contained in the copolymer composition used in the method of the present invention has an average boiling point temperature measured at 760 mm Hg (101.3 kPa) of >800° C. Most preferably, the antioxidant (or mixture of antioxidants) contained in the copolymer composition used in the method of the present invention has an average boiling point temperature measured at 760 mm Hg (101.3 kPa) of >1,000° C.

The copolymer composition used in the method of the present invention, optionally further comprises a solvent. Solvents suitable for use in copolymer composition include liquids that are able to disperse the poly(styrene)-b-poly(siloxane) block copolymer component into particles or aggregates having an average hydrodynamic diameter of less than 50 nm as measured by dynamic light scattering. Preferably, the solvent used is selected from propylene glycol monomethyl ether acetate (PGMEA), ethoxyethyl propionate, anisole, ethyl lactate, 2-heptanone, cyclohexanone, amyl acetate, γ-butyrolactone (GBL), n-methylpyrrolidone (NMP) and toluene. More preferably, the solvent used is selected from propylene glycol monomethyl ether acetate (PGMEA) and toluene. Most preferably, the solvent used is toluene.

The copolymer composition used in the method of the present invention, optionally further comprises an additive. Additives include additional polymers (including homopolymers and random copolymers); surfactants; photoacid generators; thermal acid generators; quenchers; hardeners; adhesion promoters; dissolution rate modifiers; photocuring agents; photosensitizers; acid amplifiers; plasticizers; orientation control agents; and cross linking agents. Preferred additives for use in the copolymer composition of the present invention include surfactants.

Substrates used include any substrate having a surface that can be coated with the copolymer composition in the method of the present invention. Preferred substrates include layered substrates. Preferred substrates include silicon containing substrates (e.g., glass; silicon dioxide; silicon nitride; silicon oxynitride; silicon containing semiconductor substrates such as silicon wafers, silicon wafer fragments, silicon on insulator substrates, silicon on sapphire substrates, epitaxial layers of silicon on a base semiconductor foundation, silicon-germanium substrates); plastic; metals (e.g., copper, ruthenium, gold, platinum, aluminum, titanium and alloys); titanium nitride; and non-silicon containing semiconductive substrates (e.g., non-silicon containing wafer fragments, non-silicon containing wafers, germanium, gallium arsenide and indium phosphide). Most preferred substrates are silicon containing substrates.

Optionally, in the method of the present invention, the surface of the substrate to be coated with the copolymer composition is pretreated with an interposing material before the copolymer composition is applied. Preferably, the pretreatment material acts like a tying layer interposed between the surface of the substrate and the copolymer composition to enhance the adhesion between the poly(styrene)-b-poly(siloxane) block copolymer component and the substrate. Preferably, the interposing material forms a layer selected from an imaging layer and an orientation control layer.

Imaging layers suitable for use in the method of the present invention include, for example, any type of material that can be patterned or selectively activated. Such materials include, for example, polymer brushes and a self-assembled monolayers of silane and siloxane compounds.

Orientation control layers suitable for use in the method of the present invention include neutral and non-neutral orientation control layers. That is, the orientation control layer can form an interface between the surface of the substrate and copolymer composition that is preferentially wetted by one of the poly(styrene) block or the poly(siloxane) block—i.e., a non-neutral orientation control layer. A neutral orientation control layer refers to a layer that forms an interface between the surface of the substrate and the copolymer composition that is equally wetted by both the poly(styrene) block and the poly(siloxane) block.

Preferably, the substrate is pretreated in the method of the present invention before depositing the copolymer composition to facilitate the guided self assembly of the poly(styrene)-b-poly(siloxane) block copolymer component in the copolymer composition. Specifically, the pretreatment can facilitate one of the two conventional methods used for guided self assembly of block copolymer films, namely graphoepitaxy and chemical epitaxy. In the graphoepitaxy, the surface of the substrate is prepatterned with topographical features on the surface of substrate (e.g., trenches, holes) that operate to direct the self organization of the poly(styrene) and the poly (siloxane) blocks in the poly(styrene)-b-poly(siloxane) block copolymer component of the copolymer composition.

In the chemical epitaxy, the surface of the substrate is treated with a film that exhibits a compositional pattern, wherein the affinity between the various parts of the compositional pattern is different for the poly(styrene) block and the poly(siloxane) block. This chemical affinity difference operates to facilitate the directed self assembly of the poly(styrene)-b-poly(siloxane) block copolymer component of the copolymer composition.

Preferably, in the method of the present invention, the interposing layer is formed on the substrate using a method selected from spin coating, dip coating, roll coating, spray coating and laminating (most preferably spin coating). After application of the interposing layer forming material onto the surface of the substrate, the material is optionally further processed to remove any residual solvent. Preferably, the interposing layer is baked at an elevated temperature (e.g., 70 to 340° C.) for at least 10 seconds to 5 minutes to remove any residual solvent from the interposing layer. Preferably, the baked interposing layer is rinsed with a solvent capable of removing any residual unbound interposing layer material from the surface of the substrate and then rebaked at an elevated temperature (e.g., 70 to 340° C.) for at least 10 seconds to 5 minutes to remove any residual solvent.

Applying a film of the copolymer composition comprising the poly(styrene)-b-poly(siloxane) block copolymer component and an antioxidant to the surface of the substrate in the method of the present invention preferably comprises depositing the copolymer composition onto the surface of the substrate using a method selected from spin coating, dip coating, roll coating, spray coating and laminating (most preferably spin coating). After application of a film of the copolymer composition to the substrate, the film is optionally further processed to remove any residual solvent. Preferably, the film is baked at an elevated temperature (e.g., 70 to 340° C.) for at least 10 seconds to 5 minutes to remove any residual solvent from the deposited copolymer composition.

In the method of the present invention, the deposited film of the copolymer composition is then thermally annealed by heating the film at a temperature of 275 to 350° C. (more preferably 300 to 350° C.; most preferably 320 to 350° C.) under a gaseous atmosphere for a period of 1 second to 4 hours (preferably 2 seconds to 1 hour; more preferably 30 seconds to 1 hour; most preferably 90 seconds to 1 hour) to enable the poly(styrene)-b-poly(siloxane) block copolymer component to self assemble on the surface of the substrate. Preferably, the deposited film is annealed under a gaseous atmosphere selected from air, nitrogen and argon. Preferably, the deposited film is annealed under a gaseous atmosphere having an oxygen concentration of ≤150 ppm (more preferably, ≤10 ppm; still more preferably, ≤7.5 ppm; yet still more preferably, ≤6.5 ppm; most preferably, ≤4 ppm). More preferably, the deposited film is annealed under a gaseous nitrogen or argon atmosphere having an oxygen concentration of ≤150 ppm (more preferably, ≤10 ppm; still more preferably, ≤7.5 ppm; yet still more preferably, ≤6.5 ppm; most preferably, ≤4 ppm). Most preferably, the deposited film is annealed under a gaseous nitrogen atmosphere having an oxygen concentration of ≤100 ppm (preferably, ≤7.5 ppm; more preferably, ≤6.5 ppm; most preferably, ≤4 ppm).

In the method of the present invention, the annealed film is treated to remove the poly(styrene) block in the annealed film and to convert the poly(siloxane) block in the annealed film to $SiO_x$, providing a product film with a plurality of voids (e.g., trenches perpendicular to the surface of the substrate; or a plurality of cylindrical $SiO_x$ posts with axes of symmetry perpendicular to the surface of the substrate). The treatment comprises: exposing the film to conditions that exhibit differential reactivity towards the poly(styrene) block in the film relative to the poly(siloxane) block in the film, to facilitate removal of the poly(styrene) domains from the annealed film and the conversion of the poly(siloxane) domains to $SiO_x$. Preferably, the treatment comprises: optionally, exposing the annealed film to a halogen containing plasma (e.g., $CF_4$) to remove any wetting layer that formed on the surface of the annealed film; followed by exposing the annealed film to a reactive plasma or a reactive ion etching atmosphere to remove the poly(styrene) domains and to convert the poly (siloxane) domains to $SiO_x$. Most preferably, the treatment comprises: exposing the annealed film to a halogen containing plasma to remove any wetting layer formed on the annealed film; and then exposing the annealed film to a reactive plasma or a reactive ion etching atmosphere, wherein the atmosphere comprises a plasma composed of a low pressure ionized oxidizing gas (preferably $O_2$); wherein the poly(styrene) domains in the annealed film are removed and the poly(siloxane) domains in the annealed film are converted to $SiO_x$.

Some embodiments of the present invention will now be described in detail in the following Examples.

The following materials were passed through a column packed with activated A-2 grade alumina before being used in the Examples herein, namely tetrahydrofuran (99.9% pure available from Aldrich), styrene (available from Aldrich), and cyclohexane (HPLC grade available from Fischer). All the other materials used in the Examples herein were commercial materials that were used as received.

The film thicknesses reported in the Examples herein were measured using a NanoSpec/AFT 2100 Film Thickness Measurement tool. The thickness of the films were determined from the interference of a white light passed through a diffraction grating. A standard program called "Polyimide on Silicon" was used to analyze the component wavelengths (380-780 nm) to determine the film thickness. The thickness of the poly(styrene)-b-poly(siloxane) block copolymer composition and the brush layer were measured together as one polymer layer. The reported film thickness is the combined thickness of the block copolymer composition and the brush layer.

The number average molecular weight, $M_N$, and polydispersity values reported in the Examples were measured by gel permeation chromatography (GPC) on an Agilent 1100 series LC system equipped with an Agilent 1100 series refractive index and MiniDAWN light scattering detector (Wyatt Technology Co.). Samples were dissolved in HPLC grade tetrahydrofuran (THF) at a concentration of approximately 1 mg/mL and filtered through at 0.20 μm syringe filter before injection through the two PLGel 300×7.5 mm Mixed C columns (5 mm, Polymer Laboratories, Inc.). A flow rate of 1 mL/min and temperature of 35° C. were maintained. The columns were calibrated with narrow molecular weight PS standards (EasiCal PS-2, Polymer Laboratories, Inc.).

Proton nuclear magnetic resonance ($^1$H NMR) spectroscopy results referred to in the Examples was done on a Varian INOVA 400 MHz NMR spectrometer. Deuterated tetrahydrofuran, THF, was used. A delay time of 10 seconds was used to ensure complete relaxation of protons for quantitative integrations. Chemical shifts are reported relative to tetramethylsilane.

Example 1

Preparation of Hydroxyl-Terminated Polystyrene Brush

Into a 2 liter glass reactor under a nitrogen atmosphere was added cyclohexane (1,500 g). Styrene (50.34 g) was then added to the reactor via cannula. The contents of the reactor were then heated to 40° C. Sec-butyllithium (19.18 g) diluted in cyclohexane to a concentration of 0.32 M was then rapidly added to the reactor via cannula, causing the reactor contents to turn yellow. The contents of the reactor were stirred for 30 minutes. The contents of the reactor were then cooled to 30° C. Ethylene oxide (0.73 g) was then transferred into the reactor. The contents of the reactor were stirred for 15 minutes. Then a 20 mL of a 1.4 M solution of HCl in methanol was added to the reactor. The polymer in the reactor was then isolated by precipitating into isopropanol at a ratio of 500 mL of polymer solution to 1,250 mL of isopropanol. The resulting precipitate was then filtered and dried overnight in a vacuum oven at 60° C., yielding 42 g of product hydroxyl-terminated polystyrene brush. The product hydroxyl-terminated polystyrene brush exhibited a number average molecular weight, $M_N$, of 7.4 kg/mol and a polydispersity, PD, of 1.07.

Example 2

Preparation of PSt-b-PSi Diblock Copolymer

Into a 500 mL round bottom reactor under an argon atmosphere was added cyclohexane (90 mL) and styrene (17.1 g). A 0.7 mL shot of a 1.4 M solution of sec-butyllithium in cyclohexane was then rapidly added to the reactor via cannula, causing the reactor contents to turn yellow-orange. The reactor contents were allowed to stir for 30 minutes. A small portion of the reactor contents was then withdrawn from the reactor into a small round bottomed flask containing anhydrous methanol for gel permeation chromatography analysis of the polystyrene block formed. Next 2,2,5,5-tetramethyldisilafuran (472 mg) was added to the reactor. Slowly the orange color began to fade, and after 1 hour the contents of the reactor were slightly yellow in color. Then 10.5 g of freshly sublimed hexamethylcyclotrisiloxane was transferred to the reactor. The reactor contents were allowed to react for 1.5 hours until the reactor contents were colorless. Then dry tetrahydrofuran (90 mL) was added to the reactor and the reaction was allowed to proceed for 3.25 hours. Chlorotrimethylsilane (1 mL) was then added to the reactor to quench the reaction. The product was isolated by precipitating into 500 mL of methanol and filtering. After washing with additional methanol, the polymer was redissolved in 150 mL of methylene chloride, washed three times with deionized water and then reprecipitated into 500 mL of methanol. The polymer was then filtered and dried overnight in a vacuum oven at 70° C., yielding 20.5 g. The poly(styrene)-b-poly(dimethylsiloxane) block copolymer product exhibited a number average molecular weight, $M_N$, of 24 kg/mol; a polydispersity, PD, of 1.01 and a 28 wt % poly(dimethylsiloxane) content (as determined by $^1$H NMR).

Comparative Example S1 and Examples 3-5

Preparation of Copolymer Compositions

A base spinning solution having a solids concentration of 1.6 wt % was prepared for film deposition in each of Comparative Example S1 and Examples 3-5 by dissolving PSt-b-PSi block copolymer prepared according to Example 2 in propylene glycol methyl ether acetate (Dowanol® PMA available from The Dow Chemical Company). The antioxidant noted in TABLE 1 was the added to the base spinning solution to give the noted concentration in the final spinning solution.

TABLE 1

| Ex # | Antioxidant | Product Antioxidant loading (wt % relative to PSt-b-PSi) |
|---|---|---|
| S1 | — | 0 |
| 3 | pentaerythritol tetrakis(3-(3,5-di-tert-butyl-4-hydroxyphenyl)propionate)† | 5 |
| 4 | tris(2,4-di-tert-butylphenyl) phosphite¢ | 5 |
| 5 | pentaerylthritol tetrakis(3-(3,5-di-tert-butyl-4-hydroxyphenyl)propionate)† | 10 |

†Available from BASF under the tradename IRGANOX ® 1010.
¢Available from BASF under the tradename IRGAFOS ® 168.

Example 6

Substrate Preparation

The surface of a silicon substrate having a native oxide layer was modified by spin coating thereon a 1.5 wt % (solids) solution of the hydroxyl-terminated polystyrene bush prepared according to Example 1 in toluene at 3,000 rpm for 1 minute. The substrate was then placed on a hotplate set at 150° C. for 1 minute. The substrate was then placed on a hot plate set at 250° C. under a nitrogen atmosphere for 20 minutes to anneal the deposited brush layer. The substrate was then rinsed with toluene to wash away any unattached polymer by first soaking the substrate in toluene for 1 minute and then spin drying at 3,000 rpm for 1 minute. The substrate was then baked on a hotplate set at 110° C. for one minute.

Comparative Example F1 and Examples 7-8

Film Preparation Under Nitrogen

Spinning solutions prepared according to Comparative Example S1 and Examples 3-4 were each hand filtered using a 0.2 μm Whatman syringe filter. In Comparative Example F1 and Examples 7-8 the filtered solutions from Comparative Example S1 and Examples 3-4, respectively, were then spin coated at 2,500 rpm onto separate poly(styrene) brushed substrates prepared according to Example 6. The substrates were then placed on a hotplate set at 150° C. for 1 minute. The substrates were then placed on a hotplate set at 340° C. for one hour under a nitrogen atmosphere containing <10 ppm oxygen to anneal the deposited films.

A surface wetting layer of PDMS formed on each of the annealed films at the atmosphere film interface. The annealed films were then treated using two consecutive reactive ion etching (RIE) steps using a PlasmaTherm 790i RIE to reveal the block copolymer morphology of the deposited films. First, a short $CF_4$ plasma (10 mT, 50 W) RIE treatment (8 seconds post plasma stabilization) was used to punch through the surface wetting layer of poly(dimethylsiloxane). Then, an $O_2$ plasma (6 mTorr, 90 W) RIE treatment (25 seconds post plasma stabilization) was employed to remove the polystyrene and convert the PDMS to $SiO_x$.

Figure 1:
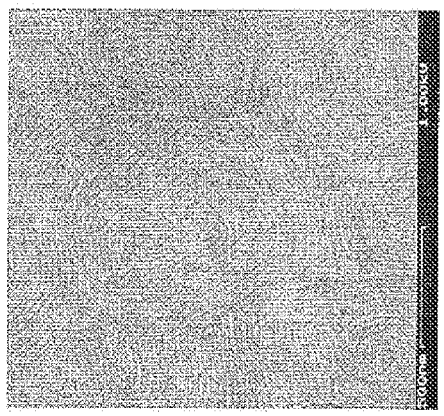
FIG. 1 is a depiction of a top down scanning electron microscopic ("SEM") image of the product film prepared according to Comparative Example F1.
Figure 2:
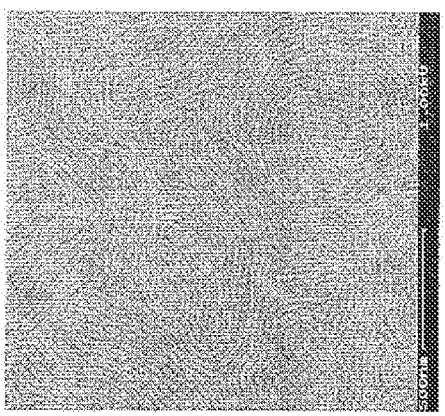
FIG. 2 is a depiction of a top down scanning electron microscopic ("SEM") image of the product film prepared according to Example 7.

The plasma treated films were then examined using a Zeiss/Leo Gemini 982 Scanning Electron Microscopy. The test samples were mounted on the SEM stage using double sided carbon tape and cleaned by blowing nitrogen prior to analysis. An image of each of the test samples was collected at 50,000× magnification. Top down SEM images of the product films prepared according to Comparative Example F1 and Examples 7-8 are shown in FIGS. 1-3, respectively. The product films prepared according to each of Comparative Example F1 and Examples 7-8 each exhibited a fingerprint pattern having a pitch, $L_0$, of 27 nm.

We claim:

1. A method for processing a substrate, comprising:
   providing a substrate having a surface;
   providing a copolymer composition, comprising:
   a poly(styrene)-b-poly(siloxane) block copolymer component, wherein the number average molecular weight of the poly(styrene)-b-poly(siloxane) block copolymer component is 5 to 1,000 kg/mol; and,
   an antioxidant;
   applying a film of the copolymer composition to the surface of the substrate;
   optionally, baking the film;
   annealing the film by heating the film at 275 to 350° C. under a gaseous atmosphere for a period of 1 second to 4 hours; and,
   treating the annealed film to remove the poly(styrene) block from the annealed film and to convert the poly(siloxane) block in the annealed film to $SiO_x$.

2. The method of claim 1, wherein the antioxidant is selected from the group consisting of:
   an antioxidant containing at least one 2,6-di-tert-butylphenol moiety;
   an antioxidant containing at least one moiety according to the formula

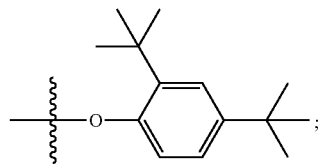

an antioxidant containing at least one moiety according to the formula

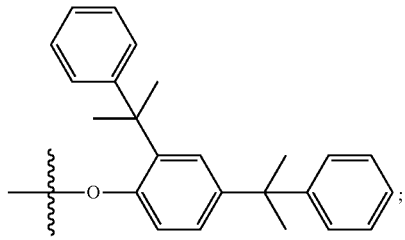 [SMILES: *Oc1ccc(C(C)(C)c2ccccc2)cc1C(C)(C)c1ccccc1]

an antioxidants containing at least one moiety according to the formula

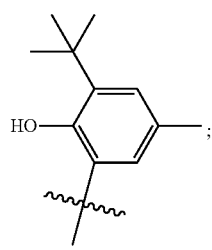 [SMILES: *c1cc(C)cc(C(C)(C)C)c1O]

and, mixtures thereof.

3. The method of claim 1, wherein the antioxidant component is an antioxidant selected from the group consisting of

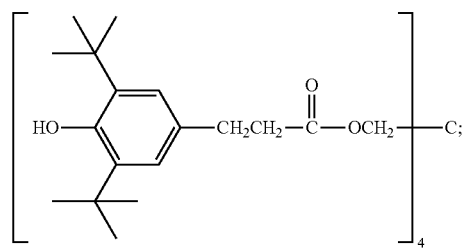

-continued

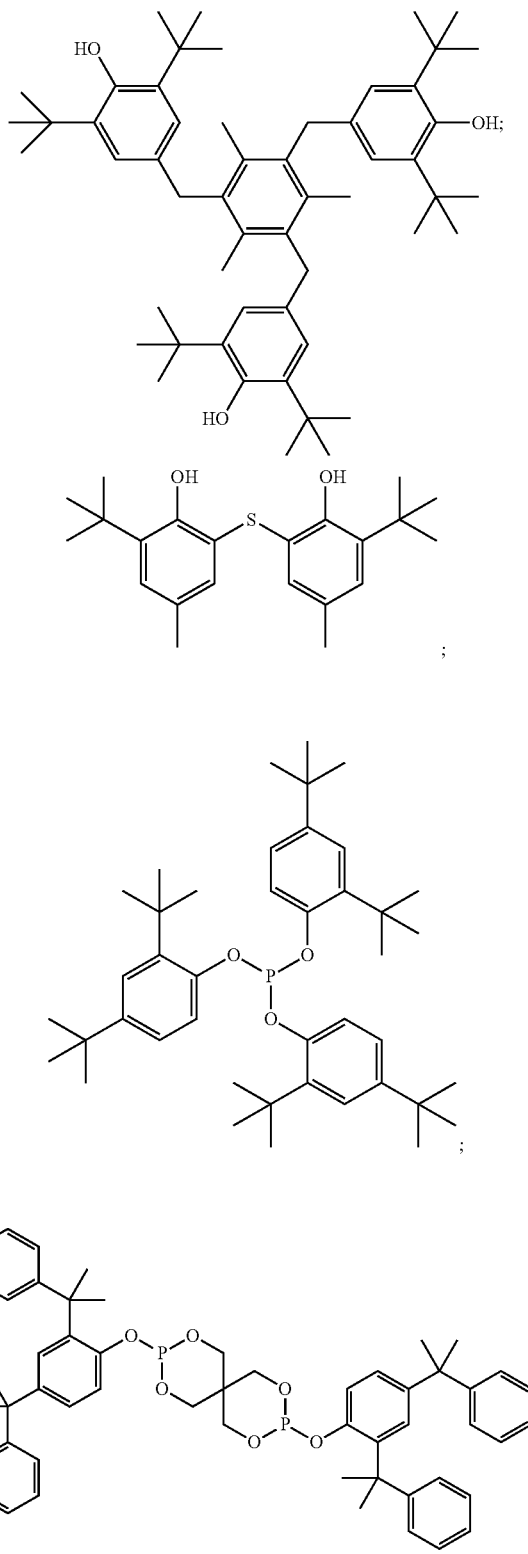

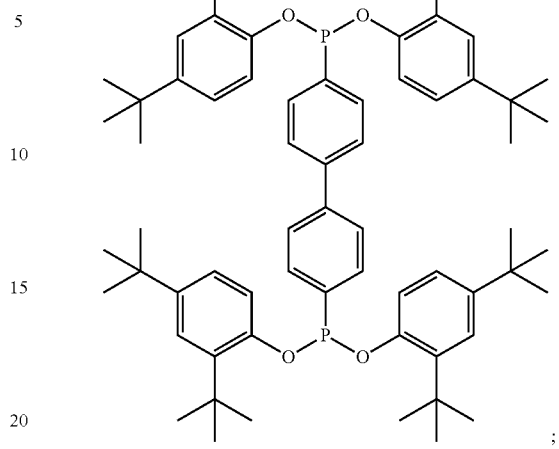

and,
mixtures thereof.

4. The method of claim 2, wherein the poly(styrene)-b-poly(siloxane) block copolymer component provided is a single poly(styrene)-b-poly(siloxane) diblock copolymer having a number average molecular weight, $M_N$, of 25 to 1,000 kg/mol; a polydispersity, PD, of 1 to 3; and a poly(siloxane) weight fraction, $Wf_{PSi}$, of 0.19 to 0.33.

5. The method of claim 4, wherein the copolymer composition provided further comprises a solvent; wherein the solvent is selected from the group consisting of propylene glycol monomethyl ether acetate (PGMEA), ethoxyethyl propionate, anisole, ethyl lactate, 2-heptanone, cyclohexanone, amyl acetate, γ-butyrolactone (GBL), n-methylpyrrolidone (NMP) and toluene.

6. The method of claim 2, wherein the poly(styrene)-b-poly(siloxane) block copolymer component is a blend of at least two different poly(styrene)-b-poly(siloxane) block copolymers;
wherein the at least two different poly(styrene)-b-poly(siloxane) block copolymers are selected from the group of poly(styrene)-b-poly(siloxane) block copolymers having a number average molecular weight, $M_N$, of 1 to 1,000 kg/mol and a polydispersity, PD, of 1 to 3; and,
wherein the blend exhibits a blend number average molecular weight, $M_{N-Blend}$, of 25 to 1,000 kg/mol.

7. The method of claim 6, wherein the blend exhibits a blend poly(siloxane) weight fraction, $Wf_{PSi-Blend}$, of 0.19 to 0.33.

8. The method of claim 7, wherein the copolymer composition provided further comprises a solvent; wherein the solvent is selected from the group consisting of propylene glycol monomethyl ether acetate (PGMEA), ethoxyethyl propionate, anisole, ethyl lactate, 2-heptanone, cyclohexanone, amyl acetate, γ-butyrolactone (GBL), n-methylpyrrolidone (NMP) and toluene.

9. The method of claim 1, wherein the gaseous atmosphere is a nitrogen atmosphere having ≤100 ppm oxygen.

* * * * *